US006922005B2

(12) United States Patent
Schreiner

(10) Patent No.: US 6,922,005 B2
(45) Date of Patent: Jul. 26, 2005

(54) MULTILAYER ACTUATOR WITH CONTACT SURFACES OF INTERNAL ELECTRODES OF THE SAME POLARITY ARRANGED OFFSET FOR THEIR EXTERNAL ELECTRODES

(75) Inventor: Hans-Jürgen Schreiner, Neunkirchen am Sand Rollhofen (DE)

(73) Assignee: Ceramtec AG Innovative Ceramic Engineering, Plochingen (DE)

( * ) Notice: Subject to any disclaimer, the term of this patent is extended or adjusted under 35 U.S.C. 154(b) by 92 days.

(21) Appl. No.: 10/076,227

(22) Filed: Feb. 14, 2002

(65) Prior Publication Data

US 2002/0195903 A1 Dec. 26, 2002

(30) Foreign Application Priority Data

Feb. 15, 2001 (DE) .......................... 101 07 505
Jan. 19, 2002 (DE) .......................... 102 01 943

(51) Int. Cl.[7] .............................................. H01L 41/08
(52) U.S. Cl. ..................... 310/328; 310/366; 310/365
(58) Field of Search .............................. 310/328, 366, 310/364, 365; H01L 41/08, 41/083

(56) References Cited

U.S. PATENT DOCUMENTS

| | | | | |
|---|---|---|---|---|
| 4,803,763 A | * | 2/1989 | Eturo et al. | ............... 310/328 |
| 4,845,399 A | * | 7/1989 | Yasuda et al. | ............ 310/366 |
| 6,316,863 B1 | * | 11/2001 | Schuh et al. | .............. 310/328 |

FOREIGN PATENT DOCUMENTS

| | | | | |
|---|---|---|---|---|
| JP | 06310278 | * | 8/1996 | .......... H01L/41/08 |
| JP | 8-167746 | * | 8/1996 | .......... H01L/41/08 |
| JP | 9-148640 | * | 9/1997 | .......... H01L/41/08 |
| JP | 09148640 | * | 9/1997 | .......... H01L/41/08 |

* cited by examiner

Primary Examiner—Tom Dougherty
Assistant Examiner—Karen Addison
(74) Attorney, Agent, or Firm—Fulbright & Jaworski L.L.P.

(57) ABSTRACT

With actuators according to prior art, it is known that, in the inactive region, which is required for contact purposes, irregularities in expansion occur. These produce cracks in the piezoelectrically inactive electrode region, which may occur at regular intervals. As a result of the irregularities in expansion, the stresses accumulate in the passively expanded regions, up to a level at which they are relieved by crack formation.

It is therefore proposed according to the invention that the contact surfaces (17), and therefore the inactive regions (15) assigned to them, of one or a predetermined number of electrodes of the same polarity (11; 30 to 37; 39, 40), arranged above one another in the same direction, are arranged offset to one another by a predetermined angle (22) of the size α, opposite the contact surfaces (17), and therefore the inactive regions (15) assigned to them, of the preceding internal electrode or a predetermined number of preceding electrodes of the same alignment and the same polarity.

20 Claims, 3 Drawing Sheets

MULTILAYER ACTUATOR WITH CONTACT SURFACES OF INTERNAL ELECTRODES OF THE SAME POLARITY ARRANGED OFFSET FOR THEIR EXTERNAL ELECTRODES

BACKGROUND OF THE INVENTION

The invention relates to a piezoceramic multilayer actuator and to a method for its manufacture.

FIG. 1 shows a diagrammatic representation of a piezoceramic multilayer actuator 1 according to the prior art. These actuators feature an inter-digitated structure. They are manufactured as monoliths; i.e. they consist of stacked thin layers 2 of piezoelectrically active material, such as lead-zirconate-titanate (PZT), with conductive internal electrodes 7 arranged between them, which are led in an alternating manner to the surface of the actuator. The active material, as what is referred to as green film is provided before sintering, by means of a screen printing process with internal electrodes 7, is pressed into a stack, pyrolysed, and then sintered, as a result of which a monolithic multilayer actuator 1 is created.

External electrodes 3, 4 connect the internal electrodes 7. As a result of this, the internal electrodes 7 are, in each case, electrically connected in parallel on one side of the actuator 1, and thus combined in a group. The external electrodes 3, 4 are the connection poles of the actuator. If an electrical voltage is applied to the connection poles via the connections 5, it is transmitted in parallel onto all the internal electrodes 7, and produces an electrical field in all layers of the active material, which is consequently mechanically deformed. The sum total of all these mechanical deformations is available at the end surfaces of the actuator as a usable expansion 6 and/or force, for example for controlling an injection valve in combustion engines.

With actuators according to prior art, it is known that irregularities in expansion occur in the inactive region which is required for the purpose of contacting. These produce cracks in the piezoelectrically inactive electrode region, which can occur at regular intervals. This situation is represented in FIG. 1.

As a result of the expansion irregularities, the stresses in the passively expanded regions accumulate up to an amount at which they are relieved by the formation of cracks. The cracks 8 have, as a rule, spacings of more than one millimetre with expansions of some 1 to 2 $\mu$m/mm. These cracks 8 end in what is referred to as the active region of the actuator, which generates the expansion, since only pressure stresses occur at this point.

The cracks can be tolerated for a number of applications. There are, however, some fundamental problems. If the actuator is not fully encapsulated, electric fields occur at the electrode ends which are exposed by the cracks, which can lead to the accumulation of water or polar molecules. These cause leakage currents or lead to increased degradation of the actuator's performance. In addition to this, the possibility cannot be entirely excluded that the actuators, damaged beforehand by the cracks, will fail during operation because of fragmentation. In addition, the external electrodes are subjected to particular stress in the region of the cracks, and tear or come free. Failure of the external electrode leads to a total failure of an actuator.

The object of the invention is to eliminate as far as possible the causes of the occurrence of crack-forming stresses.

The solution of the object is achieved in accordance with the device and method according to the present invention.

A multilayer actuator in accordance with the invention differs from actuators of the prior art in that the surfaces for contacting with their external electrodes like the internal electrodes of same polarity, do not lie one above another in a straight direction. The internal electrodes of the multilayer actuator according to the invention have a contact region delimited by their base surface, tongue-shaped and pointing outwards. The front sides of these contact regions are the contact surfaces. Only these contact surfaces reach to the surface of the actuator and are connected to the respective external electrode in each case in order to connect the internal electrodes of the same polarity. Due to the aforementioned shape of the internal electrodes an inactive region with a width capable of being predetermined is formed in the tongue-shaped contact region. The contact surfaces, and therefore the inactive regions assigned to them, of one or a predetermined number of internal electrodes of the same polarity and arranged above one another in the same direction, are arranged offset by a specified angle a against the contact surfaces, and therefore the inactive regions assigned to them of the said internal electrodes, or a predetermined number of said internal electrodes aligned in the same direction, of the same polarity. As a result of this, inactive regions come into being, which are passively expanded.

The surfaces of the internal electrodes of the same polarity which are to be contacted are therefore arranged according to the invention at regular intervals offset at a predeterminable angle. The advantage in comparison with the prior art is that the stresses in the inactive regions can no longer total such a value that cracks occur.

After a predetermined amount, which is based on the size of the stresses occurring in this region, the offset should be so great, as a multiple of the angle $\alpha$, that at least the contact surfaces of the first and last of the internal electrodes of the same polarity no longer overlap in this region. As a result, the critical distance in which the cracks form is overcome. Such offsets of a predetermined amount can be provided several times one behind another in a multilayer actuator, depending on its size, and may already be connected about every 0.5 mm, but should, as a function of the size of the actuator, be connected at the latest after about 3 mm, in order for the effect of the stress distribution to occur. An advantageous range is between 1 mm and 1.5 mm.

The thickness of a layer, i.e. the thickness of the piezoceramic layer and the thickness of the internal electrode, amounts, as a rule, to 100 $\mu$m, i.e. 0.1 mm. The offset at which the contact surfaces or the inactive regions no longer overlap, may occur as early as after about five layers, and should be concluded after about 30 layers. The region to be regarded as advantageous lies between about 10 and 15 layers. The offset to eliminate the covering of the contact surfaces and the inactive regions can be effected in such a way that each layer is arranged offset by a predetermined angle to the subsequent layer with an internal electrode of the same polarity. It is, however, also possible for two or more layers with internal electrodes of the same polarity initially to lie above one another in the same arrangement, before an offset is effected by a predetermined angle.

It is also possible for the offset to be continued, after the termination of one region or several regions, not only in one direction but back again in the opposite direction, so that a wave-shaped run of the offsets is formed. The application to the external electrode, however, is rendered somewhat more difficult as a result.

The actuators may feature a circular cross-section. The cross-section surface may however also be a square, a rectangle, or a polygon. When connecting the contact surfaces of internal electrodes of the same polarity on an actuator with circular cross-section and continuously zig-zagging offset, the external electrode has a helical-shaped progression. With the other design embodiments, an external electrode may extend over one side surface or, in particular with a polygonal cross-section, over several side surfaces.

For securing, the multilayer actuators may feature a continuous passage running along their longitudinal axes, with it being advantageous for these to be applied in the soft green bodies before sintering.

To reduce the stress in the inactive head and foot regions of the actuators, it is possible, by continuous reduction of the operating field strength, to form a uniform transition from active to inactive region. The reduction in the operating field strength is achieved by the distance between the internal electrodes being increased from electrode to electrode in the head and foot region, towards the respective end of the actuator in each case.

The invention is explained in greater detail on the basis of an exemplifying embodiment. The embodiment shows the structure of a multilayer actuator 10 with circular cross-section and continuous offset.

DETAILED DESCRIPTION

Figure 1:
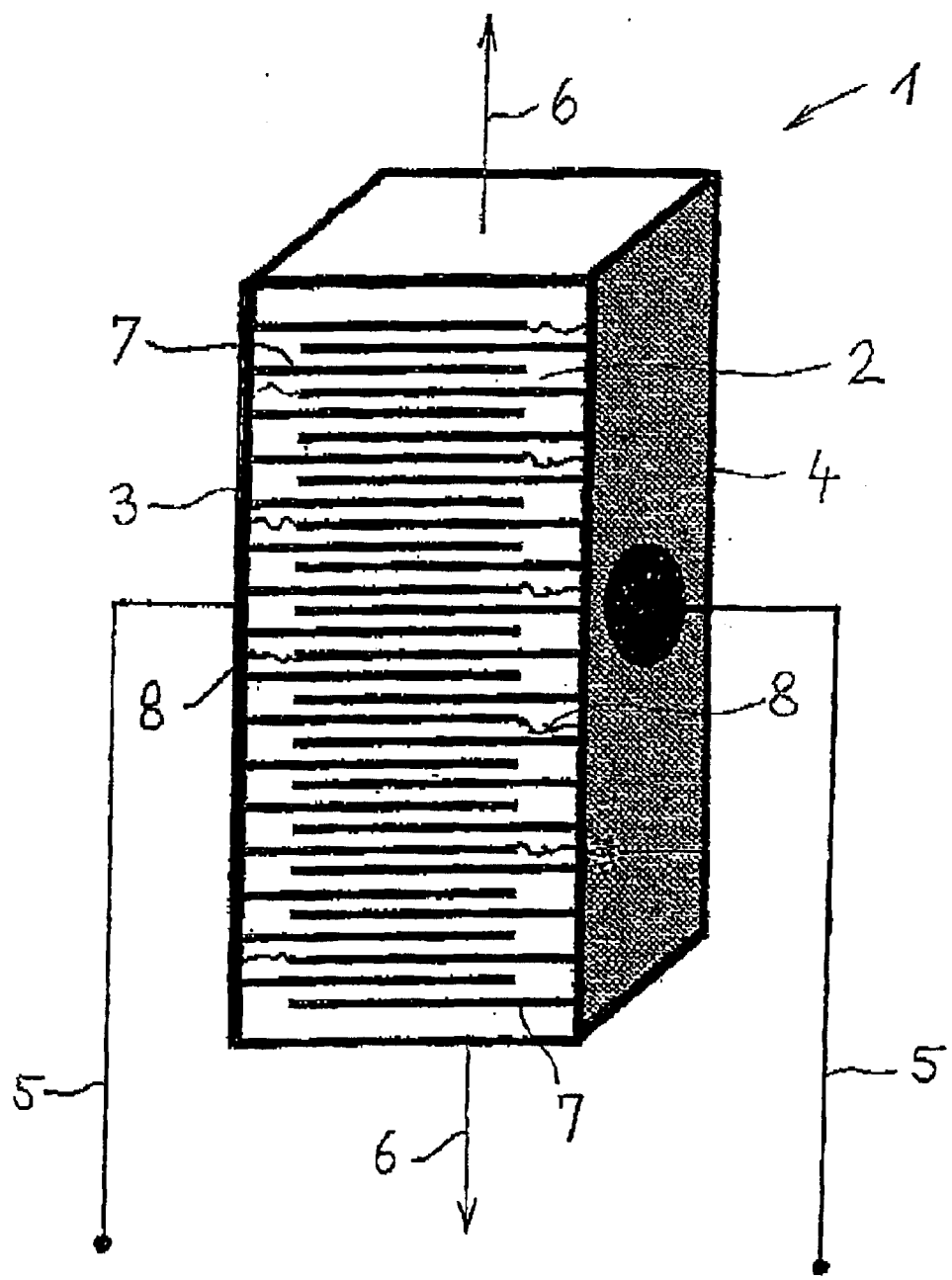
FIG. 1 shows a diagrammatic representation of a piezoceramic multilayer actuator according to the prior art.
Figure 2:
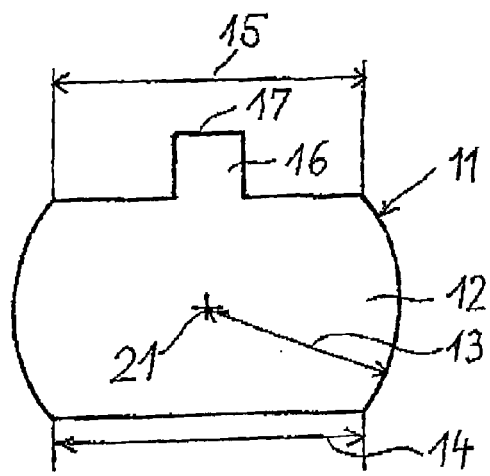
FIG. 2 shows a plan view of an internal electrode designed according to the invention.

FIG. 2 shows the design of an internal electrode 11 according to the invention. From the circular cross-section surface 12, with the radius (R) 13, a circular section with a secant 14 of length L is cut out on one side. On the opposing side, an outwardly pointing tongue-shaped contact region 16 remains, pointing outwards in the same circular cross-section with secant 15 of the same length remaining delimited by the remaining base surface 12. Because the internal electrode 11 has a specific thickness, the secant of the contact region 16 with the width b is the edge of the contact surface 17 for the connection to the external electrode.

Figure 3:
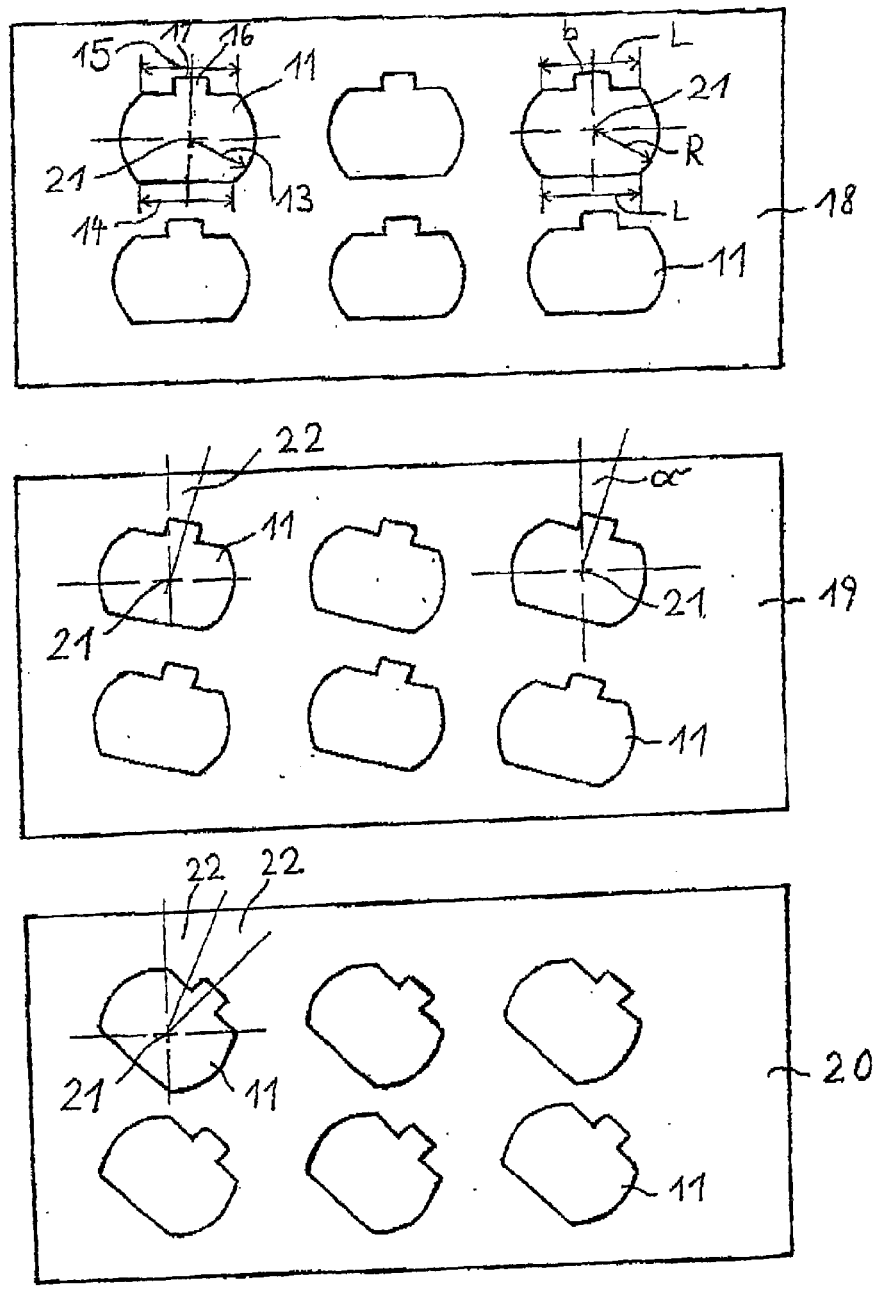
FIG. 3 shows green films of piezoceramic material for sequential layers of the multilayer actuator with several internal electrodes.

FIG. 3 shows three green films 18, 19, 20. Six internal electrodes 11 of the design according to the invention are applied on these in each case, with this application usually being effected by screen printing. The deposition of a green film with several internal electrodes allows for the rational simultaneous manufacture of several multilayer actuators at the same time. The films are stacked above one another in the required number in such a way that the internal electrodes also lie above one another, and are then separated from one another around the internal electrodes, as far as possible still in the green state because of the easy separability. Following this, likewise still in the green state, the finished processing of the multilayer actuators takes place, up to the predetermined basic diameter of the multilayer actuator.

The arrangement of the internal electrodes 11 on the respective green film 18, 19 or 20, is in each case in the same alignment. These are, for example, the first, third, and fifth films. According to the invention, an offset is effected in the direction of the internal electrodes in the subsequent film in each case, i.e. a rotation about their mid-point 21 by a predetermined angle 22 of the size a. The three green films 18, 19 and 20, accordingly feature internal electrodes of the same polarity.

Figure 4:
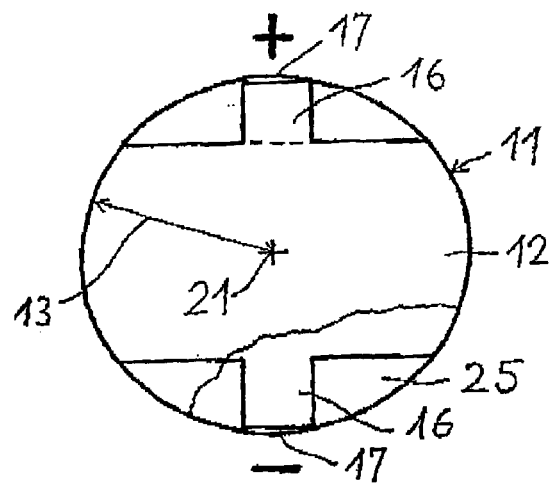
FIG. 4 shows a plan view of the arrangement of internal electrodes of different polarity.

The internal electrodes of the opposite polarity can be manufactured in the same way. In this context, however, their alignment is rotated through 180 degrees in relation to the direction of the respective internal electrode of opposite polarity, i.e. on the second, fourth, and sixth film. The electrode layers with different polarity alternate with one another. An arrangement of opposite-polarity internal electrodes of sequential films is shown by the plan view of a section through the multilayer actuator 10 in FIG. 4. The contact surface 17 of the positive pole is located rotated through 180 degrees opposite the contact surface 17 of the negative pole, separated by the ceramic film 25.

As already indicated heretofore, it is intended that, after a predetermined height h (38 in FIG. 5) at least the contact surfaces 17(b) no longer overlap, so that crack formation in the inactive regions will be avoided. The effect is optimised if, after the critical distance h, the inactive regions of the first and last film layer no longer overlap. The angle 22 of size $\alpha$, about which an internal electrode must be rotated in relation to the subsequent electrode with the same polarity, is calculated with the specified height h as follows:

$$\alpha = \left(\frac{h}{d} \cdot \arcsin\left(\frac{L}{R}\right)\right)$$

where d (23 in FIG. 5) is the total thickness of the piezoceramic layer, the green film 25, and the electrode layer 11, and R is the radius 13 of the multilayer actuator.

The films are laminated after being stacked on top of one another, with a film stack, a block, being able to comprise several multilayer actuators. In the present embodiment, these are six in number because of the internal electrodes printed onto the green films. The actuators are, for example, divided by means of a separation device into six individual rectangular quadrilaterals. Each of the quadrilaterals then corresponds to one actuator. The quadrilaterals are rotated in the green state onto the desired diameter in such a way that, in addition to the surfaces to be contacted, inactive regions are also derived for isolation on the surface. The actuators are thereafter sintered, in which situation the desired final dimension is attained by homogenous sinter shrinkage. In the sintered state the ends are ground to have parallel faces. Only the regions of the remaining contact surfaces, the contact surfaces 17 for connecting the external electrodes 24, need to be exposed by grinding. The contact surfaces 17 are provided with a basic metallisation and then an electrode made of a suitable material, for example a screen electrode made of invar, is soldered on, following the course of the connection surfaces. According to a further embodiment, the electrode layer may also consist of a conductive layer without an additional external electrode.

After the separation of the individual actuators from the film stack, the final shaping can take place even after sintering.

Figure 5:
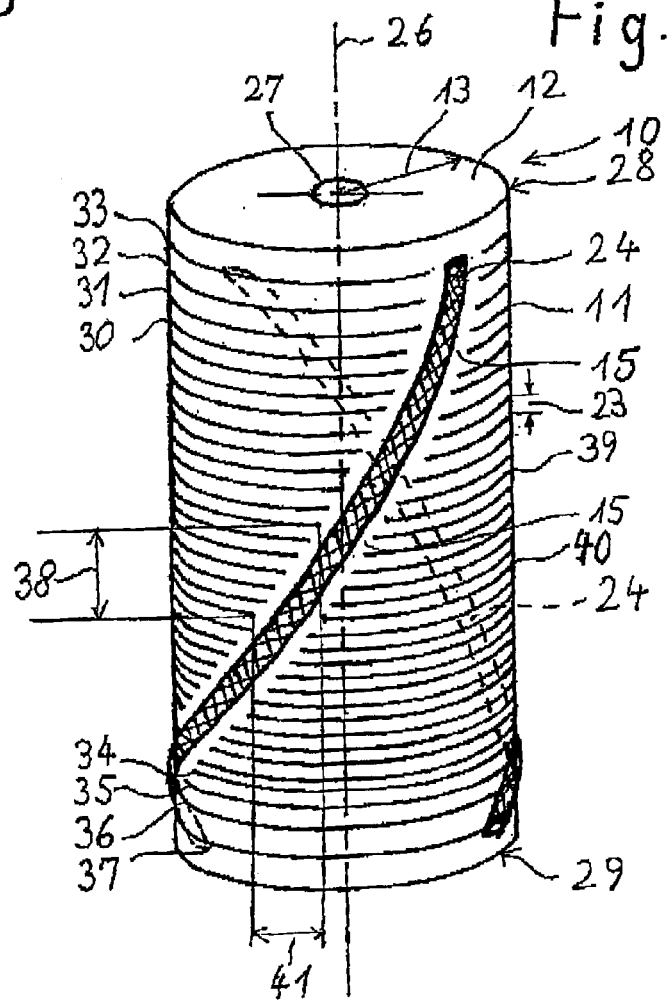
FIG. 5 shows the side view of the actuator.

FIG. 5 shows in a substantially enlarged diagrammatic representation a multilayer actuator 10 according to the invention with circular cross-section and external electrodes 24 running in helical pattern. While the external electrode s are almost entirely visible on the front face, the course of the external electrode which connects the internal electrodes 11 of opposite polarity to one another cannot be seen and is therefore drawn in as a dotted line. Running centrically to the longitudinal axis 26 is a borehole 27 for securing the actuator. In the head region 28 and the foot region 29 the transition to the inactive region in relation to the stresses occurring is uniformly in the same way, in that, by enlarging the gaps between the internal electrodes, the operational field strengths are reduced towards the respective end in each case. The distance between the electrodes 30, 31, 32 and 33 at the head 28 increases from electrode to electrode towards the end of the actuator. Likewise, the distance between the electrodes 34, 35, 36 and 37 also increases in the foot region 29. Due to the increasing of the gaps, the mechanical stresses are distributed over a larger component volume and accordingly no longer exceed the critical valve for crack formation.

The other internal electrodes 11 have the same gap between them. The contact surfaces connected to one another by the external electrodes 24, and therefore the inactive regions 15, are continuously offset against one another by the same angle. The critical distance 38($h$), after which, in the present embodiment, the offset 41 is so large that no overlap pertains any longer between the inactive regions 15 of electrodes 11 of the same polarity, is attained after six electrode layers or layers 23, as can be enumerated between the electrodes 39 and 40.

What is claimed is:

1. A piezoceramic multilayer actuator comprising alternating internal electrodes that have contact surfaces and lead to the surface of the actuator having inactive regions assigned to them, wherein internal electrodes of the same polarity are connected by their contact surfaces to form a parallel circuit to corresponding external electrodes, wherein said external electrodes are arranged on opposing sides of the actuator, wherein contact surfaces, and therefore the inactive regions assigned to them of one or a predetermined number of internal electrodes of the same polarity, arranged above one another in the same direction, are arranged offset to the another by a predetermined angle of the value a with respect to the contact surfaces, and therefore the inactive regions assigned to these, of the preceding internal electrode or a predetermined number of preceding same-internal electrodes of the same alignment; wherein α is calculated according to the formula $$\alpha = \{(h/d) \cdot \arcsin(L/R)\}$$

wherein h is the predetermined height;
d is the total thickness of the piezoceramic layer, the green film and the electrode layer;
L is the length of a secant on a cross-sectional surface of the inner electrode;
and R is the radius of the multilayer actuator.

2. A piezoceramic multilayer actuator according to claim 1, wherein the offset is of such a size, as a multiple of the predetermined angle according to a predetermined height, and therefore a predetermined number of layers, comprising a layer of piezoceramic material with internal electrodes located thereon, and wherein at least the contact surfaces of the first and the last of the internal electrodes of the same polarity in this range no longer overlap.

3. A piezoceramic multilayer actuator according to claim 1, wherein offset, as a multiple of the predetermined angle, according to a region of a predetermined height and therefore of a predetermined number of layers, comprising a layer of piezoceramic material with an internal electrodes located thereon, is so large that the inactive regions of the first and the last of the internal electrodes of the same polarity in this region no longer overlap.

4. A piezoceramic multilayer actuator according to claim 1, wherein offset is determined in a region of from about 0.5 mm to about 3 mm, corresponding to some 5 to 30 layers, which in each case consist of the piezoceramic material and the internal electrode located thereon.

5. A piezoceramic multilayer actuator according to claim 4, wherein the offset is determined in a region of from about 1 mm to about 1.5 mm, corresponding to at least 10 to 15 layers.

6. A piezoceramic multilayer actuator according to claim 1, wherein an offset is provided several times in succession in a multilayer actuator, depending on its size.

7. A piezoceramic multilayer actuator according to claim 6, wherein the offset is reversed in the opposite direction in each case after the completion of one region or several regions, so that a wave-shaped run of the offsets is produced.

8. A piezoceramic multilayer actuator according to claim 1, wherein the actuator has a circular cross-section.

9. A piezoceramic multilayer actuator according to claim 8, wherein the external electrodes have a helical run at the connection of the contact surfaces of internal electrodes with the same polarity with a constant running offset of the contact surfaces.

10. A piezoceramic multilayer actuator according to claim 1, wherein the cross-section surface of the actuator is a square, a rectangle, or a polygon.

11. A piezoceramic multilayer actuator according to claim 10, wherein an external electrode runs over one side surface or, in particular in the case of a polygonal cross-section, over several side surfaces.

12. A piezoceramic multilayer actuator according to claim 1, wherein the actuator has a through borehole along its longitudinal, axis.

13. A piezoceramic multilayer actuator according to claim 1, wherein pocket holes are provided at its ends.

14. A piezoceramic multilayer actuator according to claim 1, wherein the head region and in the foot region of the actuator the internal electrode spacing increases from electrode to electrode towards the respective end of the actuator.

15. A piezoceramic multilayer actuator according to claim 1, wherein the actuator is a constituent part for the control of an injection valve.

16. A method for the manufacture of a piezoceramic multilayer actuator according to claim 1, comprising the steps of positing several internal electrodes of the same polarity, with co-aligned contacting surfaces for the external electrode, in each instance on a green film made of a piezoceramic material, wherein the internal electrodes of the same polarity are positioned on the subsequent green film with the respective offset in each case generated by a predetermined angle a to the position of the preceding electrode in order to obtain the offset of the contact surfaces wherein the corresponding internal electrodes of opposing polarity are located on the green films rotated through 180 degrees in each case, laying the green films of opposing polarity are then laid on top of one another to form a blocks with the contact surfaces, and therefore the assigned inactive regions of one or of a predetermined number of electrodes of the same polarity, arranged above one another in the same direction, being arranged offset to one another by the predetermined angle a opposite the contact surfaces, and therefore the assigned inactive regions of the preceding internal electrode or a predetermined number of preceding electrodes of the same alignment and same polarity, and wherein the actuators are then prepared from this block.

17. A method for the manufacture of a multilayer actuator according to claim 16, wherein the processing for shaping a multilayer actuator in the green state is conducted prior to sintering.

18. A method for the manufacture of a multilayer actuator according to claim 16, wherein the processing for shaping a multilayer actuator is carried out subsequent to sintering.

19. A method for the manufacture of a multilayer actuator according to claim 16, wherein subsequent to the sintering of the actuator, the sinter skin is left on its surface, and only ground are die regions for exposing the electrodes, at which the contact surfaces of the internal electrodes are connected to the external electrode.

20. A method for the manufacture of a piezoceramic multilayer actuator according to claim 2, comprising the steps of positing several internal electrodes of the same polarity, with co-aligned contacting surfaces for the external electrode, in each instance on a green film made of a piezoceramic material, wherein the internal electrodes of the same polarity arc positioned on the subsequent green film with the respective offset in each case generated by a predetermined angle a to the position of the preceding electrode in order to obtain the offset of the contact surfaces wherein the corresponding internal electrodes of opposing polarity are located on the green films rotated through 180 degrees in each case, laying the green films of opposing polarity are then laid on top of one another to form a block, with the contact surfaces, and therefore the assigned inactive regions of one or of a predetermined number of electrodes of the same polarity, arranged above one another in the same direction, being arranged offset to one another by the predetermined angle a opposite the contact surfaces, and therefore the assigned inactive regions of the preceding internal electrode or a predetermined number of preceding electrodes of the same alignment and same polarity, and wherein the actuators are then prepared from this block.

* * * * *